United States Patent [19]

Yokoyama et al.

[11] Patent Number: 5,723,234
[45] Date of Patent: Mar. 3, 1998

[54] PHASE SHIFT PHOTOMASK AND PHASE SHIFT PHOTOMASK DRY ETCHING METHOD

[75] Inventors: Toshifumi Yokoyama; Hiroyuki Miyashita, both of Tokyo, Japan

[73] Assignee: Dai Nippon Printing Co., Ltd., Tokyo, Japan

[21] Appl. No.: 608,065

[22] Filed: Feb. 28, 1996

[30] Foreign Application Priority Data

Feb. 28, 1995 [JP] Japan .................. 7-039677

[51] Int. Cl.⁶ .................................. G03F 9/00
[52] U.S. Cl. ................................. 430/5; 430/312
[58] Field of Search ..................... 430/5, 311, 312, 430/313, 314; 156/626

[56] References Cited

U.S. PATENT DOCUMENTS

| | | | |
|---|---|---|---|
| 5,005,075 | 4/1991 | Kobayashi et al. | 430/5 |
| 5,597,668 | 1/1997 | Nowak et al. | 430/5 |

*Primary Examiner*—S. Rosasco
*Attorney, Agent, or Firm*—Sughrue, Mion, Zinn, Macpeak & Seas, PLLC

[57] ABSTRACT

A phase shift photomask capable of being produced by dry etching with adequate in-plane uniformity of pattern dimension even if there is a large difference in exposed area ratio between different areas on the mask. In a phase shift photomask having an area provided with a phase shift layer which practically shifts the phase relative to another area, a dummy etching pattern (13) for dry etch rate correction is provided in an area other than a pattern exposure area (9 and 10), or a dummy etching pattern for dry etch rate correction having a size less than the limit of resolution attained by transfer is provided in the pattern exposure area, thereby reducing the etch rate nonuniformity due to the pattern density variation in the process of dry etching the phase shift photomask, and thus providing a phase shift photomask of high accuracy.

6 Claims, 2 Drawing Sheets

Single-layer halftone type

Multilayer halftone type

Quartz substrate engraving type

PHASE SHIFT PHOTOMASK AND PHASE SHIFT PHOTOMASK DRY ETCHING METHOD

BACKGROUND OF THE INVENTION

The present invention relates to a phase shift photomask. More particularly, the present invention relates to a phase shift photomask capable of being produced by dry etching with adequate in-plane uniformity of pattern dimension even if there is a large difference in exposed area ratio between different areas on the mask, and also relates to a dry etching method for producing such a phase shift photomask.

With the achievement of high integration density of semiconductor integrated circuits, there has recently been an increasing demand for reduction in the pattern dimension of reticles which are used in fabrication of semiconductor integrated circuits. For example, in the case of DRAMs, which are of a typical type of LSI, the line width of device patterns which are transferred by using reticles assumes a very small value, i.e. 0.5 μm in the case of the existing 16M-bit DRAMs. In the case of 64M-bit DRAMs, photoengraving for fine-line patterns thereof cannot be effected by the conventional stepper photolithography method because of the resist pattern resolution limit of this method. To comply with these demands, various exposure methods have heretofore been studied. Among them is an exposure method which uses a phase shift photomask. Use of a phase shift photomask enables an improvement in resolution even with an existing stepper. Therefore, various phase shift photomasks have been actively developed.

Phase shift photomasks which have heretofore been developed include a single-layer halftone phase shift photomask which comprises, as shown in the sectional view of FIG. 1(a), a transparent substrate 1 and patterns which are formed on the substrate 1 from a chromium compound or a molybdenum silicide compound layer 2 which serves as both a phase shift layer and a halftone layer, and a multilayer halftone phase shift photomask which comprises, as shown in the sectional view of FIG. 1(b), a transparent substrate 1 and patterns which are formed on the substrate 1 from a combination of a halftone light-blocking layer 3 and a phase shift layer 4 (see Japanese Patent Application No. 3-287832, "Manufacturing of half-tone phase shift masks I. Blank", Proc. Photomask Japan '94, SPIE Vol. 2254 Photomask and X-ray Mask Technol. 238 (1994), "Practical attenuated phase-shifting mask with a single-layer absorptive shifter of MoSiO and MoSiON for ULSI fabrication", Proc. IEEE Int. Electron Devices Meeting, Washington D.C. (1993)). Phase shift photomasks which have heretofore been developed further include a quartz substrate engraving type phase shift photomask in which, as shown in the sectional view of FIG. 1(c), a transparent quartz substrate 1 is provided at a surface thereof with repeated patterns which are formed from a light-blocking layer 5, and the surface of the transparent substrate 1 is etched at alternate space portions 6 by an amount corresponding to a half-wavelength of a stepper light source (see Japanese Patent Application Unexamined Publication (KOKAI) No. 62-189468). In production of these phase shift type reticles, dry etching is used as essential technique.

In the case of a phase shift photomask, even a slight dimension variation on the mask has a large effect on the dimension of patterns transferred onto a wafer. Therefore, phase shift type reticles require higher in-plane dimension uniformity than conventional reticles.

Further, in a quartz substrate engraving type phase shift photomask such as that shown in FIG. 1(c), a phase difference (i.e. an etch depth difference) in a plane appears as a difference in dimension of patterns transferred onto a wafer. Therefore, the in-plane uniformity of phase difference must be within 2°, i.e. 4 nm in terms of etch depth (in the case of a phase shift photomask for i-line). Accordingly, dry etching plays a significant role in improving the quality and yield of phase shift photomasks.

Wet etching of chromium for a conventional reticle is carried out by using an etching agent such as a mixed aqueous solution of ammonium ceric nitrate and perchloric acid. In wet etching, however, as the line width and other pattern dimensions become smaller, as described above, it becomes more difficult to form sharp fine patterns of a light-blocking film or the like. As a result, the finished patterns suffer from considerable roughness. For this reason, full-scale application of dry etching has recently begun in a part of this field in order to etch sharp fine patterns as halftone phase shift photomasks are introduced into production lines.

However, unlike dry etching used in the IC production process, dry etching of photomasks suffers from a serious problem that the in-plane dimension distribution has pattern dependence (loading effect), and this causes the in-plane uniformity of dimension to be degraded. Examples of this problem will be explained below with reference to FIGS. 2(a) and 2(b). FIGS. 2(a) and 2(b) show examples of reticles for 16M-bit DRAMs. FIG. 2(a) shows an example of a hole pattern layer, in which a halftone chromium film 7 has fiducial marks (alignment marks) 8 provided in the periphery thereof, and main patterns 9, which are hole patterns, are provided in the central portion of the halftone chromium film 7. Because this is a hole pattern layer, the exposed area ratio is low, and the pattern density distribution is relatively uniform. In contrast, another layer in the same series has, as shown in FIG. 2(b), a wide etching area (glass portion) 10 around the main patterns 9. Therefore, the pattern density variation is considerably large. Generally, dry etching of chromium shows large pattern dependence. Therefore, if a pattern configuration having a large pattern density variation, as shown in FIG. 2(b), is formed by dry etching, the peripheral and central portions of the mask are etched at different rates. For example, if there is a large open pattern or the like, activated species which contribute to etching are consumed in a large quantity at this portion. Therefore, the etch rate for patterns in the neighborhood of that portion decreases. If there is a large difference in exposed area ratio between the peripheral and central portions of the mask as shown in FIG. 2(b), an etch rate difference arises in a plane, resulting in a large difference in dimension between the peripheral and central portions of the mask. The nonuniform in-plane dimension distribution cannot completely be improved simply by adjusting dry etching conditions.

The following are some principal factors that cause the photomask dry etching process to show larger pattern dependence than dry etching used in the IC production process:

① In the case of wafers, the same pattern is transferred onto a large number of areas in a plane, and therefore, the in-plane pattern density variation is small; in some photomasks, the in-plane pattern density variation is undesirably large, as stated above.

② Photomasks generally use a fused quartz glass plate as a substrate, and the thickness of the substrate is several millimeters. Quartz glass is electrically non-conductive by nature and has a small specific heat value. Therefore, it is difficult to control etching of the photomasks.

③ Particularly, etching of chromium is a reaction which is mainly carried out by radicals. Therefore, it suffers a large CD (critical dimension) loss (i.e. difference between the resist dimension and the chromium dimension). Accordingly, an in-plane etch rate difference directly affects the dimension distribution.

SUMMARY OF THE INVENTION

In view of the above-described problems, an object of the present invention is to provide a phase shift photomask designed so that, when the phase shift photomask is produced by dry etching, adequate in-plane uniformity of pattern dimension can be obtained even if there is a large difference in exposed area ratio between different areas of the mask.

Another object of the present invention is to provide a dry etching method for producing the above-described phase shift photomask.

To solve the above-described problems, the present invention provides a phase shift photomask which is characterized in that a dummy etching pattern for dry etch rate correction is provided in an area in the peripheral portion of the mask which has no effect on the actual exposure process, thereby minimizing the etch rate difference between the peripheral and central portions of the mask, and thus enabling reduction of the pattern dimension difference. When a dry etch rate correcting dummy etching pattern is provided in a pattern exposure area, the size of the dummy etching pattern is reduced to a value less than the limit of resolution attained by the exposure wavelength used, thereby minimizing the etch rate difference between the peripheral and central portions of the mask, and thus enabling reduction of the pattern dimension difference. It is desirable to change the dry etch rate correcting dummy etching pattern according to the area and density distribution of patterns to be transferred.

The following is an example of a dummy etching pattern of a size less than the limit of resolution attained by the employed exposure wavelength, which is provided in the pattern exposure area. In the case of a single-layer type halftone photomask for a hole layer used in an exposure process which employs i-line as exposure wavelength, for example, as shown in FIG. 3, a hole pattern of 0.5 μm in size is disposed as a dummy etching pattern 11 around a multiplicity of chips 9' (in a pattern exposure area). Regarding the shape of a dummy etching pattern, it is generally desirable to select a hole dummy etching pattern for a hole-based pattern and a line dummy etching pattern for a line-based pattern. It is the same with the case of a quartz substrate engraving type phase shift photomask.

A size less than the resolution limit may be expressed by a mathematical formula as follows (see Japanese Patent Application Unexamined Publication (KOKAI) No. 6-175347):

A pattern repeating pitch P of halftone portions is given by $$P = \alpha \cdot \lambda / NA$$

where:

$\alpha$ = a constant: $\alpha \leq 0.8$;

$\lambda$ = the exposure wavelength; and

NA = the numerical aperture of the lens.

Assuming that the ratio of the dimension of each halftone portion to the dimension of an open portion (glass portion) between each pair of adjacent halftone portions is $\alpha$, it is necessary to satisfy the following relationship:

$$\alpha = \beta \cdot T^{1/2}$$

where:

T = the transmittance of the halftone portions; and $\beta$ = a constant: $0.5 \leq \beta \leq 2.0$.

That is, the present invention provides a phase shift photomask having an area provided with a phase shift layer which practically shifts the phase relative to another area. The phase shift photomask is characterized in that a dummy etching pattern for dry etch rate correction is provided in an area other than a pattern exposure area.

In addition, the present invention provides another phase shift photomask having an area provided with a phase shift layer which practically shifts the phase relative to another area. The phase shift photomask is characterized in that a dummy etching pattern of a size less than the limit of resolution attained by transfer is provided in a pattern exposure area.

The present invention may be applied to any of the following known phase shift photomasks: a single-layer or multilayer halftone phase shift photomask consisting essentially of a molybdenum silicide compound; a single-layer or multilayer halftone phase shift photomask consisting essentially of a chromium compound; a quartz substrate engraving type phase shift photomask; and so forth.

It is desirable that the exposed area ratio in the area which is provided with the dummy etching pattern and the exposed area ratio in the other etching area should be approximately equal to each other.

In addition, the present invention provides a phase shift photomask dry etching method which is carried out in a process for producing a phase shift photomask having an area provided with a phase shift layer which practically shifts the phase relative to another area. The method is characterized in that dry etching is carried out with a dummy etching pattern for dry etch rate correction provided in an area other than a pattern exposure area.

In addition, the present invention provides another phase shift photomask dry etching method which is carried out in a process for producing a phase shift photomask having an area provided with a phase shift layer which practically shifts the phase relative to another area. The method is characterized in that dry etching is carried out with a dummy etching pattern for dry etch rate correction provided in a pattern exposure area, the dummy etching pattern having a size less than the limit of resolution attained by transfer.

The method according to the present invention may be applied to any of the following known phase shift photomasks: a single-layer or multilayer halftone phase shift photomask consisting essentially of a molybdenum silicide compound; a single-layer or multilayer halftone phase shift photomask consisting essentially of a chromium compound; a quartz substrate engraving type phase shift photomask; and so forth.

It is desirable that the exposed area ratio in the area which is provided with the dummy etching pattern and the exposed area ratio in the other etching area should be approximately equal to each other.

According to the above-described phase shift photomask and phase shift photomask dry etching method of the present invention, a dummy etching pattern for dry etch rate correction is provided in an area in the peripheral portion of the mask which has no effect on the actual pattern process (i.e. an area other than the pattern exposure area) in either a single-layer or multilayer halftone phase shift photomask or a quartz substrate engraving type phase shift photomask, thereby minimizing the etch rate difference between the peripheral and central portions of the mask, and thus enabling reduction of the pattern dimension difference. When a dry etch rate correcting dummy etching pattern is provided in the pattern exposure area, the size of the dummy etching pattern is reduced to a value less than the limit of resolution attained by the exposure wavelength used, thereby minimizing the etch rate difference between the peripheral and central portions of the mask, and thus enabling reduction of the pattern dimension difference.

It is desirable to change the dry etch rate correcting dummy etching pattern according to the area and density distribution of patterns to be transferred. Particularly, it is desirable that the peripheral and central portions of the mask should be approximately equal to each other in the exposed area ratio, which is the ratio of the area of the opening portion to the area of the light-blocking portion. The reason for this is as follows:

Generally, dry etching of chromium or the like shows large pattern dependence. That is, the etch rate differs for a large pattern than for a small pattern. If there is a large open pattern or the like, activated species which contribute to etching are consumed in a large quantity at this portion. Therefore, the etch rate for patterns in the neighborhood of that portion reduces. For this reason, if there is a large difference in exposed area ratio between the peripheral and central portions of the mask as shown for example in FIGS. 4(a) and 4(b), which will be described later, an etch rate difference arises in a plane, resulting in a large difference in dimension between the peripheral and central portions of the mask. Therefore, a dummy etching pattern is provided so that the exposed area ratios (opening areas) in the peripheral and central portions of the mask become approximately equal to each other, thereby uniformizing the etch rate in a plane. As a result, the in-plane dimension distribution improves.

It should be noted that the phase shift photomask according to the present invention can be applied to exposure processes using g-line, i-line, and Deep UV (in the region of 250 nm) by optimizing the material and film thickness of the mask.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Examples of the phase shift photomask and phase shift photomask dry etching method according to the present invention will be described below.

<EXAMPLE 1>

In this example, a dummy etching pattern for dry etch rate correction is applied to an i-line halftone phase shift photomask having a double-layer structure comprising a chromium oxide nitride film (130 nm in thickness) and a chromium nitride film (10 nm in thickness).

The reticle has patterns formed in a 3-chip configuration for 16M-bit DRAMs, and it is applied to a bit-line layer. As an etching mask for this mask, novolak photoresist NPR-895i (manufactured by Nagase Sangyo k.k.) was used, and resist pattern exposure was written by using CORE-2564 (manufactured by Etec Systems Inc.). Then, the photoresist was developed with an inorganic alkaline developer, and the chromium oxide nitride and chromium nitride exposed through the openings of the resist pattern were etched by reactive ion etching using a mixed gas containing dichloromethane ($CH_2Cl_2$) and oxygen.

Figure 1A:
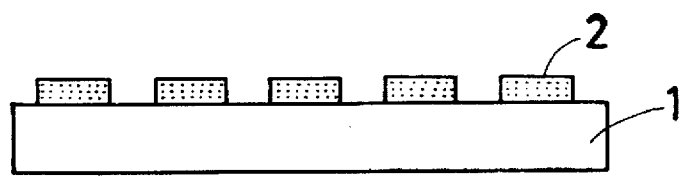
FIGS. 1(a), 1(b) and 1(c) are sectional views showing the arrangements of halftone and quartz substrate engraving type phase shift photomasks to which the present invention is directed.
Figure 1B:
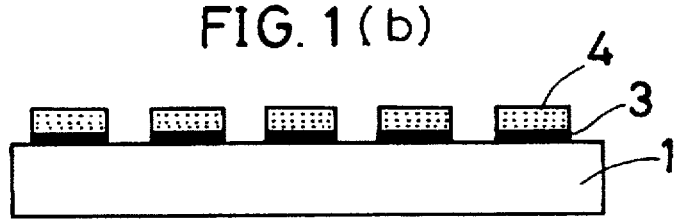
Figure 1C:
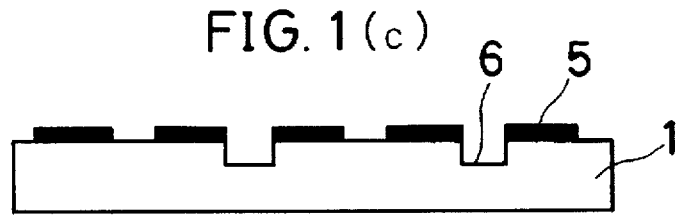
Figure 2A:
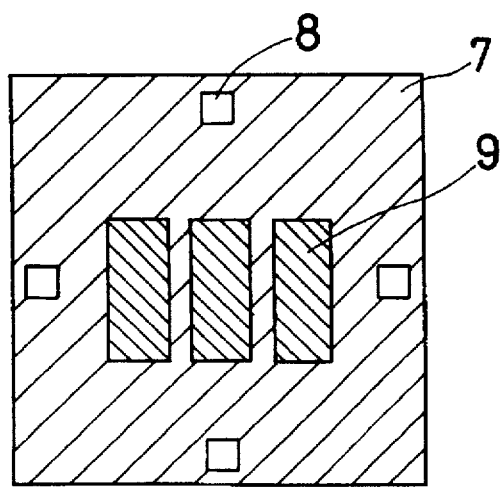
FIGS. 2(a) and 2(b) are views used to explain that the in-plane dimension distribution shows pattern dependence in dry etching of a phase shift photomask.
Figure 2B:
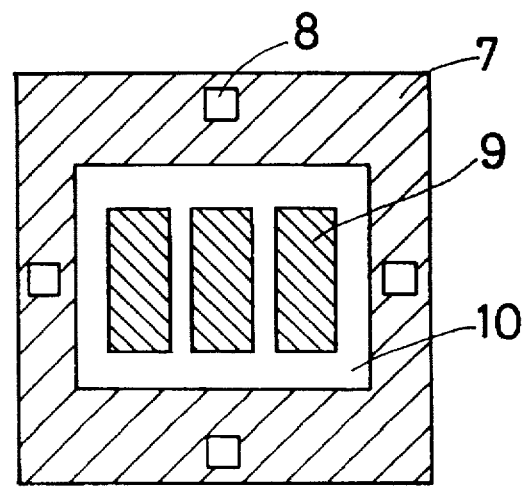
Figure 3:
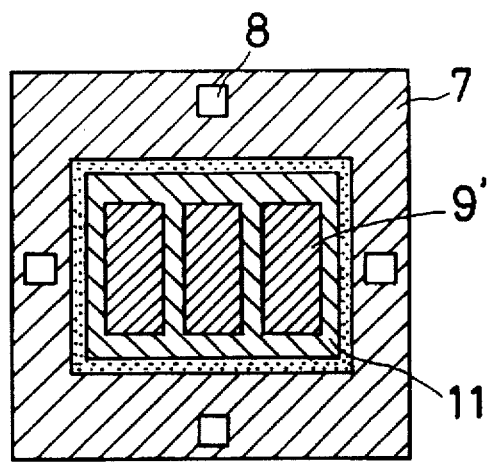
FIG. 3 schematically shows an example of an arrangement in which a dummy etching pattern for dry etch rate correction is provided in a pattern exposure area.
Figure 4A:
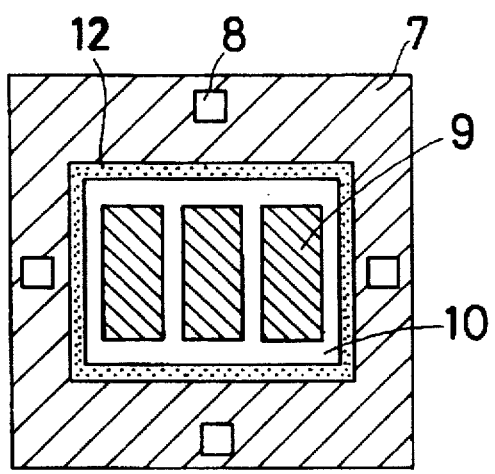
FIGS. 4(a) and 4(b) schematically show a phase shift photomask before and after a dummy etching pattern for dry etch rate correction according to Example 1 is provided.
Figure 4B:
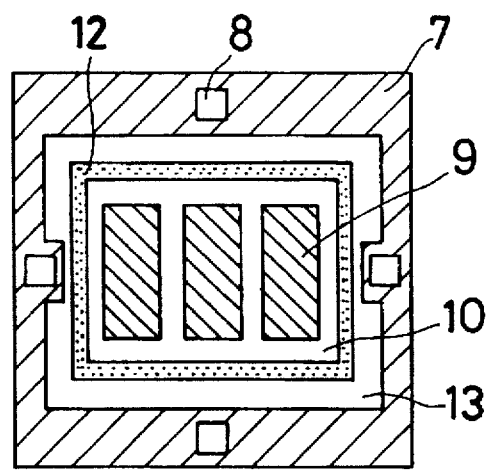

FIGS. 4(a) and 4(b) show the phase shift photomask before and after a dummy etching pattern for dry etch rate correction is provided. In the figures, reference numeral 7 denotes a halftone chromium portion, 8 fiducial marks (alignment marks), 9 main patterns provided in the central portion, 10 a glass portion around the main patterns 9, and 12 a light-blocking frame which surrounds the main patterns 9. The light-blocking frame 12 comprises patterns formed with a size less than the limit of resolution attained by the employed exposure wavelength in order to cause an interference between light passing through the light-blocking pattern portion and light passing through the surrounding halftone chromium portion, thereby reducing the light intensity to such an extent that exposure is not affected, and thus preventing marginal light rays from leaking in the area of the main patterns 9 and giving rise to a problem during multiple exposure in the wafer transfer process. The light-blocking frame 12 is a characteristic pattern of the halftone phase shift photomask. The area inside the light-blocking frame 12 is used as a pattern exposure area during transfer. As shown in FIG. 4(b), a dummy etching pattern 13 for dry etch rate correction according to the present invention is provided outside the light-blocking frame 12. The dummy etching pattern 13 is a non-segmented open pattern (i.e. a pattern to be etched).

In a case where no dummy etching pattern for dry etch rate correction is provided as shown in FIG. 4(a), the value 3δ (standard deviation of dimension) of the dimension distribution is as large as 0.04 μm. In contrast, in a case where the dummy etching pattern 13 for dry etch rate correction is provided as shown in FIG. 4(b), the value 3δ of the dimension distribution becomes favorably small, i.e. 0.02 μm. Thus, it was confirmed that the in-plane dimension distribution can be improved by the present invention.

<EXAMPLE 2>

In this example, a dummy etching pattern for dry etch rate correction is applied to a quartz substrate engraving type i-line phase shift photomask.

The reticle has patterns formed in a 2-chip configuration for 64M-bit DRAMs, and it is applied to a word-line layer. As an etching mask for this mask, novolak photoresist NPR-895i (manufactured by Nagase Sangyo k.k.) was used, and resist pattern exposure was carried out by using CORE-2564 (manufactured by Etec Systems Inc.). Then, the photoresist was developed with an inorganic alkaline developer, and the quartz exposed through the openings of the resist pattern was etched by reactive ion etching using $CF_4$ gas.

Figure 5A:
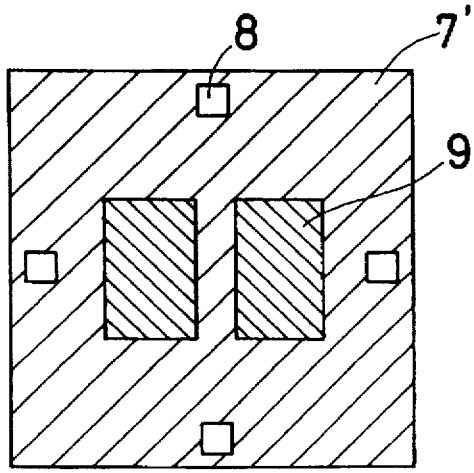
FIGS. 5(a) and 5(b) schematically show a phase shift photomask before and after a dummy etching pattern for dry etch rate correction according to Example 2 is provided.
Figure 5B:
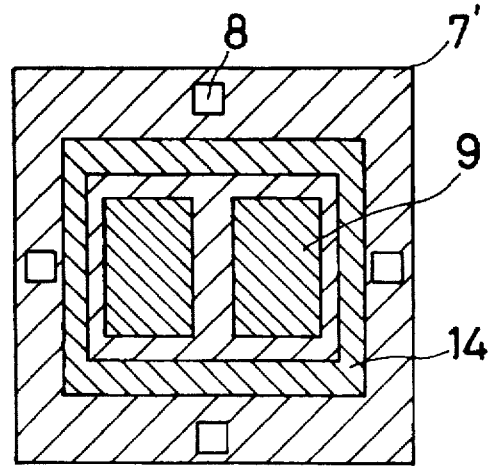

FIGS. 5(a) and 5(b) show the phase shift photomask before and after a dummy etching pattern for dry etch rate correction is provided. In the figures, reference numeral 7' denotes a chromium portion, 8 fiducial marks (alignment marks), 9 main patterns provided in the central portion, and 14 a dummy etching pattern for dry etch rate correction which is provided around the main patterns 9. The dummy etching pattern 14 is a line-and-space pattern of 1.75 μm which has an exposed area ratio approximately equal to that of the main patterns 9. A comparison was made between a phase shift photomask provided with the dummy etching pattern 14 and a phase shift photomask having no dummy etching pattern 14 by measuring the value 3δ of the etch depth distribution. In the case of the phase shift photomask having no dummy etching pattern 14, the value 3δ was 6 nm (3° in terms of the phase difference), whereas, in the case of the phase shift photomask provided with the dummy etching pattern 14, the value 3δ was 4 nm (2° in terms of the phase difference). Thus, it was confirmed that the in-plane phase difference distribution can be improved by the present invention.

As will be clear from the foregoing description, according to the phase shift photomask and phase shift photomask dry etching method of the present invention, a dummy etching pattern for dry etch rate correction is provided in an area other than the pattern exposure area. Alternatively, a dummy etching pattern for dry etch rate correction of a size less than the limit of resolution attained by transfer is provided in the pattern exposure area. Accordingly, it is possible to reduce the etch rate nonuniformity due to the pattern density variation in the process of dry etching the phase shift photomask.

It should be noted that the present invention is widely applicable not only to dry etching of phase shift photomasks but also to other fields of microfabrication by dry etching.

What is claimed is:

1. A phase shift photomask having an area provided with a phase shift layer which results in shifting a phase relative to another area, said phase shift photomask comprising a dummy etching pattern for dry etch rate correction, said dummy etching pattern being provided in an area other than a pattern exposure area.

2. A phase shift photomask having an area provided with a phase shift layer which results in shifting a phase relative to another area, said phase shift photomask comprising a dummy etching pattern for dry etch rate correction, said dummy etching pattern being provided in a pattern exposure area, said dummy etching pattern having a size less than a limit of resolution attained by transfer.

3. A phase shift photomask according to claim 1 or 2, which is a single-layer or multilayer halftone phase shift photomask consisting essentially of a molybdenum silicide compound.

4. A phase shift photomask according to claim 1 or 2, which is a single-layer or multilayer halftone phase shift photomask consisting essentially of a chromium compound.

5. A phase shift photomask according to claim 1 or 2, which is a quartz substrate engraving type phase shift photomask.

6. A phase shift photomask according to claim 1 or 2, wherein an exposed area ratio in the area which is provided with said dummy etching pattern and an exposed area ratio in an etching area other than said area are approximately equal to each other.

* * * * *